(12) United States Patent
Wang

(10) Patent No.: US 7,248,104 B2
(45) Date of Patent: Jul. 24, 2007

(54) OPERATIONAL AMPLIFIER

(75) Inventor: Zhenhua Wang, Zurich (CH)

(73) Assignee: NXP B.V., Eindhoven (NL)

( * ) Notice: Subject to any disclaimer, the term of this patent is extended or adjusted under 35 U.S.C. 154(b) by 86 days.

(21) Appl. No.: 10/524,570

(22) PCT Filed: Aug. 12, 2003

(86) PCT No.: PCT/IB03/03647

§ 371 (c)(1),
(2), (4) Date: Feb. 15, 2005

(87) PCT Pub. No.: WO2004/017514

PCT Pub. Date: Feb. 26, 2004

(65) Prior Publication Data

US 2005/0231275 A1   Oct. 20, 2005

(30) Foreign Application Priority Data

Aug. 19, 2002  (EP) ................................ 02018582

(51) Int. Cl.
*H03F 1/02* (2006.01)

(52) U.S. Cl. ........................ 330/9; 330/253; 330/257

(58) Field of Classification Search ................ 330/9, 330/253, 257, 260
See application file for complete search history.

(56) References Cited

U.S. PATENT DOCUMENTS

| | | | | |
|---|---|---|---|---|
| 4,524,329 A | * | 6/1985 | Abou ......................... | 330/253 |
| 4,622,521 A | | 11/1986 | Redfern | |
| 4,760,349 A | * | 7/1988 | Park et al. .................. | 330/264 |
| 4,884,039 A | | 11/1989 | King et al. | |
| 5,508,656 A | * | 4/1996 | Jaffard et al. .................. | 330/9 |
| 6,225,863 B1 | | 5/2001 | Miwa | |
| 6,583,660 B2 | * | 6/2003 | Blon et al. .................. | 327/307 |
| 6,586,990 B2 | * | 7/2003 | Udo et al. .................... | 330/9 |
| 6,621,333 B1 | * | 9/2003 | Chen ............................. | 330/9 |
| 6,683,441 B2 | * | 1/2004 | Schiff et al. ................. | 323/222 |
| 2005/0110550 A1 | * | 5/2005 | Shi et al. .................... | 327/307 |

FOREIGN PATENT DOCUMENTS

| | | |
|---|---|---|
| EP | 0032533 A1 | 7/1981 |
| EP | 0635173 B1 | 1/1992 |
| WO | WO9317493 A1 | 9/1993 |
| WO | WO9907067 A1 | 2/1999 |

* cited by examiner

*Primary Examiner*—Patricia Nguyen

(57) ABSTRACT

An operational amplifier includes a current provider that introduces an additional current Ic to an internal node A of the operational amplifier for reducing the output offset voltage of the operational amplifier.

10 Claims, 4 Drawing Sheets

OPERATIONAL AMPLIFIER

The invention relates to an operational amplifier and to a method for reducing the output offset voltage of an operational amplifier.

Operational amplifiers are widely known in the state of the art. They are employed in most areas of analog electronics, analog-digital interface electronics and mixed signal electronics. In communication ICs (integrated circuits), for example, operation amplifiers play an important role in performing various functions such as amplification, filtering, conversion, buffering, etc.

When designing an operational amplifier, a variety of important performance parameters has to be taken into account, for instance DC (direct current) gain, GBW (gain bandwidth) product, phase margin, input referred noise, etc. Another important performance parameter is the output offset voltage of the amplifier, which is the output voltage of an operational amplifier with its input terminals being connected together. For ideal operational amplifiers, this output voltage is zero because they are offset-free. In practice, it is more convenient to consider an input referred offset voltage, which is defined as the output offset voltage of an operational amplifier, divided by the differential voltage gain of the operational amplifier. In precision applications, a large offset cannot be tolerated, and the demand for operational amplifiers having an extremely low offset is constantly increasing. Systematic offsets can be avoided by proper design. A proper design, however, is not suited to preclude random offsets, which may occur in particular due to device mismatches.

For illustration, FIG. 4 shows the basic structure of a common two-stage CMOS (complementary metal-oxide semiconductor) operational amplifier.

In the depicted operational amplifier, the sources of three PMOS (p-channel metal-oxide semiconductor) transistors MP3, MP4 and MP5 are connected in parallel to a voltage supply Vdd.

The drain of transistor MP3 is coupled to the gate of transistors MP3, MP4 and MP5 and moreover via a current source Ibs to ground Gnd.

The drain of transistor MP4 is connected via node C in parallel to the source of two further PMOS transistors MP1 and MP2. The gates of transistors MP1 and MP2 are connected to respective input terminals IN1, IN2 of the operational amplifier. The drain of transistor MP1 is connected via node A to the drain of a first NMOS (n-channel metal-oxide semiconductor) transistor MN1 and the drain of transistor MP2 is connected via node B to the drain of a second NMOS transistor MN2. The respective source of both NMOS transistors MN1 and MN2 is connected to ground Gnd, while node A is coupled in addition to the gate of both NMOS transistors MN1 and MN2.

The drain of transistor MP5 is connected via node D to the drain of yet another NMOS transistor MN3. The source of this transistor MN3 is connected to ground Gnd, while its gate is coupled to node B. Node B is connected in addition via a series of a resistor Rc and a capacitor Cc to node D. Node D is connected to the output terminal OUT of the operational amplifier.

Resistor Rc and capacitor Cc are responsible for a frequency compensation in the operational amplifier. Current source Ibs ensures that a predetermined current is provided to nodes C and D via transistors MP4 and MP5.

The ensemble of transistors MP1, MP2, MP3, MP4, MN1 and MN1 and current source Ibs forms a differential input stage of the operational amplifier, while the ensemble of transistors MP5 and MN3 forms the second stage of the operational amplifier.

Different potentials applied to the input terminals IN1, IN2 will result in different potentials at nodes A and B of the differential input stage. The second stage then amplifies this difference and provides a corresponding output voltage at the output terminal OUT of the operational amplifier.

Mismatches between transistors MP1 and MP2 as well as between transistors MN1 and MN2, however, will lead to a potential at node B differing from the expected potential at node B even in case the potential applied to input terminals IN1 and IN2 is balanced. This additional difference will be amplified by the second stage and appear as offset at the output terminal OUT of the operational amplifier. Also a mismatch between transistors MP4 and MP5, as well as a mismatch between transistors MN3 and MN2 will be reflected directly in an voltage offset at the output OUT of the operational amplifier.

While there are effective offset-cancellation techniques for time discrete applications which allow to design operational amplifiers with an extremely low random offset, such as auto zero, no comparable technique is available for continuous time applications.

For continuous time applications, the random offset is usually counteracted with large transistor sizes and high currents. This approach reduces the relative amount of mismatches, but it has the disadvantage that it requires large silicon sizes and causes high costs. Moreover, this approach enables only a limited success. Since the random offset varies with temperature and supply voltage and depends strongly on a good matching of the employed components, it is rather difficult to keep the offset always as low as required. There are in particular limitations in meeting more stringent requirements. Furthermore, the systematic offset is also affected by process variations. From time to time, a batch having a quality far below the average may be encountered, for example when the manufacturing is transferred to another foundry. This may lead to a significant increase in the input referred voltage offset.

In document U.S. Pat. No. 6,225,863 B1 it is proposed to replace MOS transistors of an operation amplifier by a plurality of switchable MOS transistors in parallel. By switching one or more of these parallel transistors on or off, the size of the equivalent transistor can be altered in order to compensate for a device mismatch. However, the finite number of parallel switchable transistors results in a quantization error in the compensation. Moreover, the parallel transistors occupy a large area and require a complex controlling, which makes the proposed solution less suitable for practical implementations.

Document EP 0 635 173 B1 proposes to employ MOS transistors with a floating gate, in order to be able to store compensation information. This approach has the disadvantage, however, that a rather high voltage is required.

Document WO 99/07067 proposes a configuration in which an offset of a CMOS operational amplifier is adjusted by varying the back bias voltage of the input MOS transistors. This approach allows in general only a compensation of small offsets, though. Moreover, the control voltage lies close to ground or to the supply voltage, which makes a realization difficult.

It is an object of the invention to enable an improved reduction of a voltage offset at the output of an operational amplifier for continuous time applications.

This object is reached according to the invention with an operational amplifier comprising means for providing an additional current to at least one internal node of the operational amplifier for reducing the output offset voltage of the operational amplifier. An internal node is given by any connection between different components within the operational amplifier.

The object of the invention is equally reached with a method for reducing the output offset voltage of an operational amplifier, which method comprises providing an additional current to at least one internal node of the operational amplifier.

The invention proceeds from the consideration that the most effective offset reduction or cancellation can be achieved if the offset is controlled electrically. It is proposed that such an electrical control is realized by introducing an additional current at one or more nodes within the amplifier.

It is an advantage of the invention that the offset can be controlled exactly with such an additional current any time, while at the same time a significant influence on other performance parameters of the operational amplifier can be avoided.

If the additional current is exactly equal to the current causing the output offset voltage of the operational amplifier but with an opposite polarity, the output offset voltage can be canceled completely.

The invention can be realized with any kind of operational amplifier, for example in a two-stage CMOS operational amplifier similar to the one depicted in FIG. 4.

Preferred embodiments of the invention become apparent from the dependent claims.

Advantageously, the proposed means for providing an additional current are realized with a voltage supply and a transconductor. The transconductor may provide the additional current depending on a voltage provided by the voltage supply. Preferably, the voltage supply is controllable. In this case, size and direction of the provided additional current can be adjusted easily by adjusting the voltage provided by the controllable voltage supply. For a particularly simple embodiment, such a transconductor may consist of, for example, just a differential stage.

In a further preferred embodiment of the invention, the operational amplifier comprises feedback means, which detect an offset at the output of the operational amplifier and which control the means for applying the additional current based on the detected offset in a way that the output offset reduces basically to zero. With such feedback means, the offset can be compensated exactly, continuously and automatically. Thereby, the offset can be kept particularly low and stable. In case the means for applying the additional current include a controllable voltage supply and a transconductor as proposed above, the feedback means can control the voltage supply according to a detected offset.

When selecting the node or nodes of the operational amplifier at which the additional current is to be inserted, it should be taken care that the influence by the additional current on the other performance parameters of the operation amplifier is kept to a minimum, in order to avoid the necessity of a redesign.

In the case the invention is to be employed for an operational amplifier which is similar to the one described with reference to FIG. 4, for example, such a node is given by depicted node A, since this is a node of low impedance which is moreover suitable for an accurate offset control. The offset control can then be designed almost independently from the designing of the operational amplifier itself, i.e. a redesign of the entire operational amplifier is not required for implementing the invention.

Other objects and features of the present invention will become apparent from the following detailed description considered in conjunction with the accompanying drawings, wherein FIG. 1 illustrates the principle of the invention;

Figure 1:
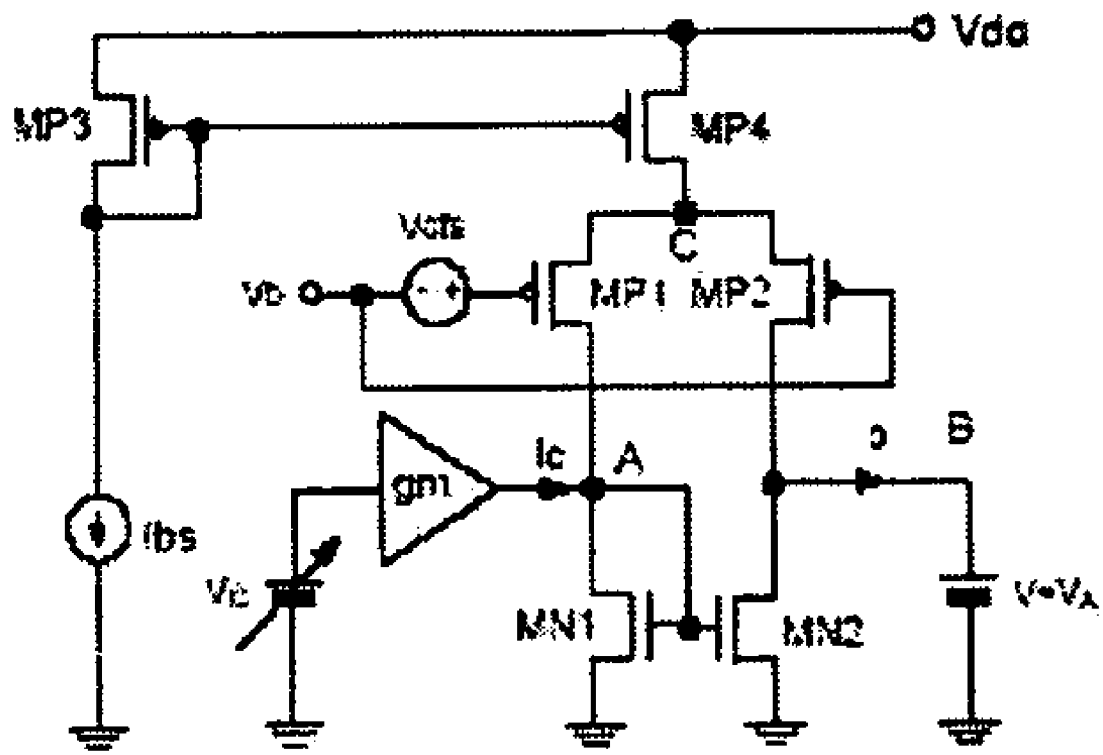

First, the principle of the invention will be explained with reference to FIG. 1. FIG. 1 shows a part of an operational amplifier which has the same structure as the above described operational amplifier of FIG. 4, and the same reference signs were employed. Transistors MP5 and MN3, resistor Rc and capacitor Cc, which form again part of the operational amplifier, are not shown in FIG. 1. Both input terminals IN1, IN2 are now connected to a DC bias voltage Vb, for example the input common-mode voltage in application.

The circuit depicted in FIG. 1 is further supplemented in accordance with the invention with means for providing an additional current. These means are composed of a controllable voltage source S and a transconductor T. One terminal of the voltage source S is connected to ground Gnd and the other terminal is connected to transconductor T and provides a voltage Vc to transconductor T. Transconductor T has a transconductance gm, which is assumed to be linear for a first approach. The output current Ic of the transconductor T is fed to node A of the operational amplifier as additional current. The size of current Ic can be adjusted by changing the size of the voltage Vc supplied by the controllable voltage source S to transconductor T.

The effect of additional current Ic on the offset of the operational amplifier will now be explained. Since the offset of the second stage of the operational amplifier is divided by the gain of the first stage of the operational amplifier of FIG. 1 when referred to the input, and since the gain of the first stage is typically around 100, the offset of the second stage, which is not shown in FIG. 1, may be neglected in the following considerations.

An offset caused by mismatches between transistors MP1 and MP2 and between transistors MN1 and MN2 can be modeled by an equivalent input offset Vofs between the two input terminals IN1, IN2, as indicated in FIG. 1. Each input offset Vofs causes a current $Io \neq 0$ from node B of the differential input stage to the second stage, which corresponds directly to an offset in the output voltage of the operational amplifier. For the first approach, very small values of the input offset Vofs will be assumed in order to allow a small signal analysis.

Figure 4:
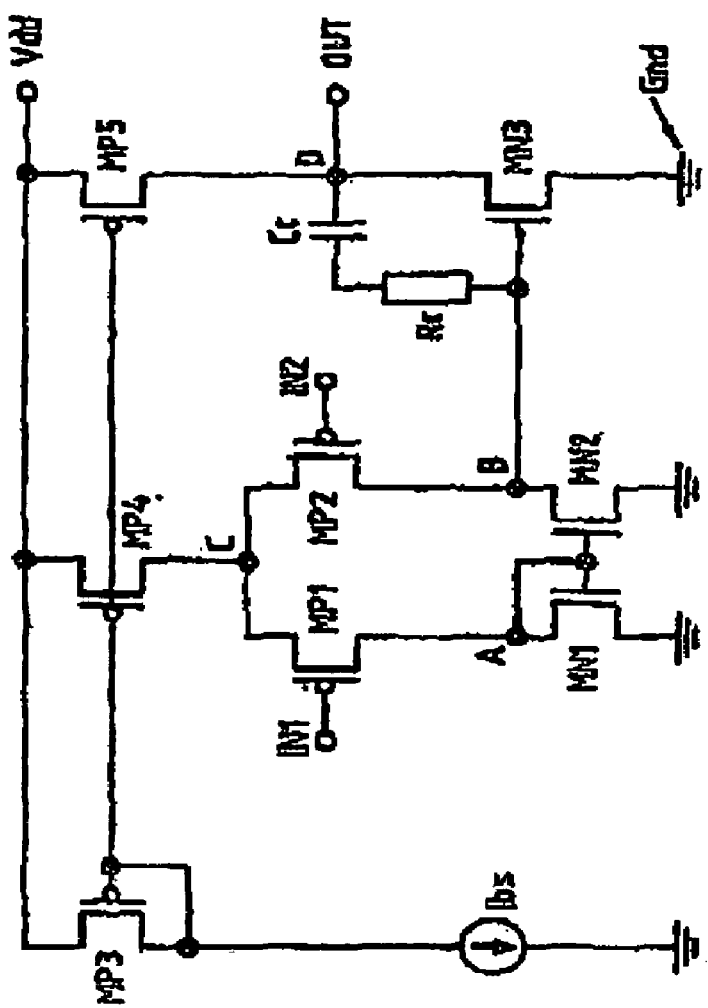
FIG. 4 shows a conventional CMOS operational amplifier.

By adding a current Ic to node A, the output offset current Io will be altered, if node B is kept to a potential which is the same as node A. This is modeled in FIG. 1 with a voltage supply $V=V_A$ between node B and ground Gnd. It is to be noted that this requirement applies only for an offset analysis which is based on the depicted configuration. As the output offset current is considered here, node B should have the same potential as node A ideally. In real applications, in which the second stage of the operational amplifier is present as shown in FIG. 4 and in which the output offset voltage is to be reduced, this requirement is not given.

For the first approach, Io can be approximated by the following equation:

$$Io \approx Gm \cdot Vofs - gm(Vc + Vofc), \tag{1}$$

where Gm is the transconductance of transistors MP1 and MP2 and where Vofc is the input referred offset of the transconductor T.

Equation (1) indicates that the offset of the operational amplifier can be adjusted by varying voltage Vc in the required direction and to a required size.

The control voltage Vc which is required for a complete offset compensation can be derived from the above equation to be:

$$Vc = \frac{Gm}{gm} Vofs - Vofc. \tag{2}$$

In order to achieve a high precision, the control voltage should have a high level. The typical offset of a CMOS operational amplifier is about a few mV. In order to employ a control voltage Vc of up to 1V, the ratio between $Gm$ and $gm$ has to be a few hundreds. With such a huge ratio, the effect of the noise added by transconductor T can be neglected.

In the approach described with reference to FIG. 1, a small-signal analysis was conducted, for which small input offsets Vofs and a linear transconductance Gm were assumed. The obtained results therefore constitute only an approximation. Nevertheless, these results can be used as basis for quick estimation and dimensioning etc.

More accurate results can be obtained by performing a large-signal analysis. Such a large-signal analysis will be presented in the following with reference to FIG. 2.

Figure 2:
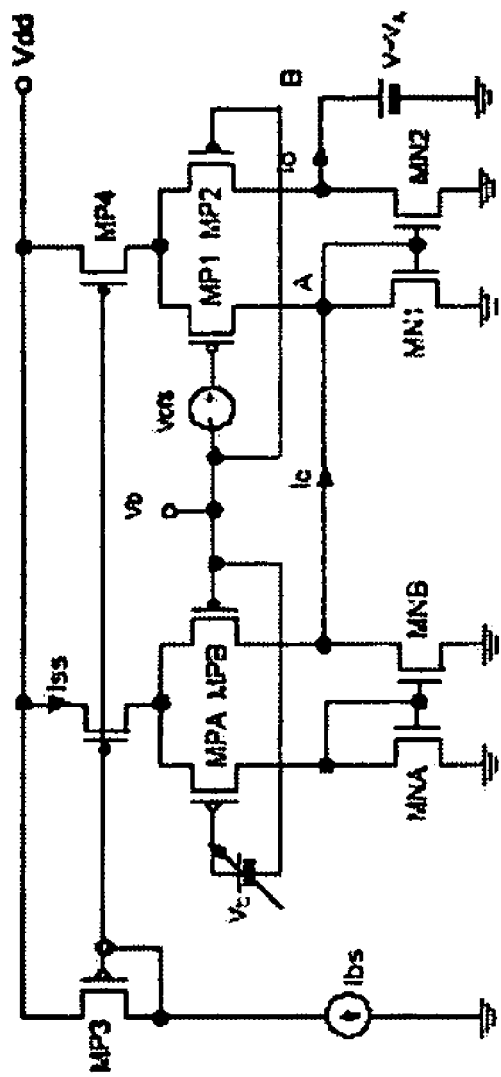
FIG. 2 shows a practical embodiment of an operational amplifier according to the invention.

FIG. 2 illustrates a practical implementation of an operational amplifier according to the invention. The depicted operational amplifier corresponds to the operational amplifier of FIG. 1, except that linear transconductor T is substituted by an additional differential stage providing a transconductance. In practice, the offset compensation is accomplished by varying Vc to achieve a current Io of zero. In general, this will require a feedback. For a feedback, feedback means (not shown) determine the offset at the output of the operational amplifier when only the bias voltage Vb is applied to the input terminals of the operational amplifier. The feedback means then control the voltage supply S based on the currently determined offset. With such a feedback, the transconductance gm of FIG. 1 does not necessarily have to be linear, as long as its characteristic is monotone. Hence, a more simple transconductance gm provided for instance by a differential stage can be employed.

The additional differential stage which realizes in the operational amplifier of FIG. 2 transconductance gm comprises a PMOS transistor MPC connected with its source to voltage supply Vdd. The gate of transistor MPC is connected to current source Ibs. The drain of transistor MPC is connected in parallel via node G to the source of further PMOS transistors MPA and MPB. Current source Ibs provides a predetermined current Iss to point G via transistor MPC. Bias voltage Vb is applied in addition to the gate of transistor MPB, while the controllable voltage source S providing voltage Vc is connected between the gates of transistors MPA and MPB. The drain of transistor MPA is connected via node E to the drain of an NMOS transistor MNA and the drain of transistor MP2 is connected via node F to the drain of an NMOS transistor MNB. The source of both NMOS transistors MNA and MNB is connected to ground Gnd, while node E is coupled in addition to the gate of both NMOS transistors MNA and MNB. Finally, node F is connected to node A for supplying additional current Ic to node A.

Assuming that transistors MPA and MPB operate in their saturation region, the relationship between current Ic and controllable voltage Vc can be expressed as:

$$Ic = \sqrt{K_{MPA} Iss} \, (Vc + Vofc) \sqrt{1 - \frac{K_{MPA}(Vc + Vofc)^2}{4 Iss}} \tag{3}$$

In this large-signal equation, $K_{MPA}$ is the transconductance of transistors MPA and MPB and Iss is the tail current of the stage. It can be seen that the characteristic of the differential stage is monotone, as required.

A corresponding large-signal equation can be set up for the relationship between current Io and input offset voltage Vofs, with Ic=0. When equating Io and Ic, the exact voltage Vc that is required to compensate input offset voltage Vofs can then be obtained analytically.

Using the proposed additional differential stage as transconductance gm has the advantage that the characteristic of Ic vs. Vc and the characteristic of Io vs. Vofs, with Ic=0, are very similar to each other. Thus, a relatively linear relationship can be expected between the input offset voltage Vofs and the voltage Vc required for compensating this input offset voltage Vofs.

Figure 3:
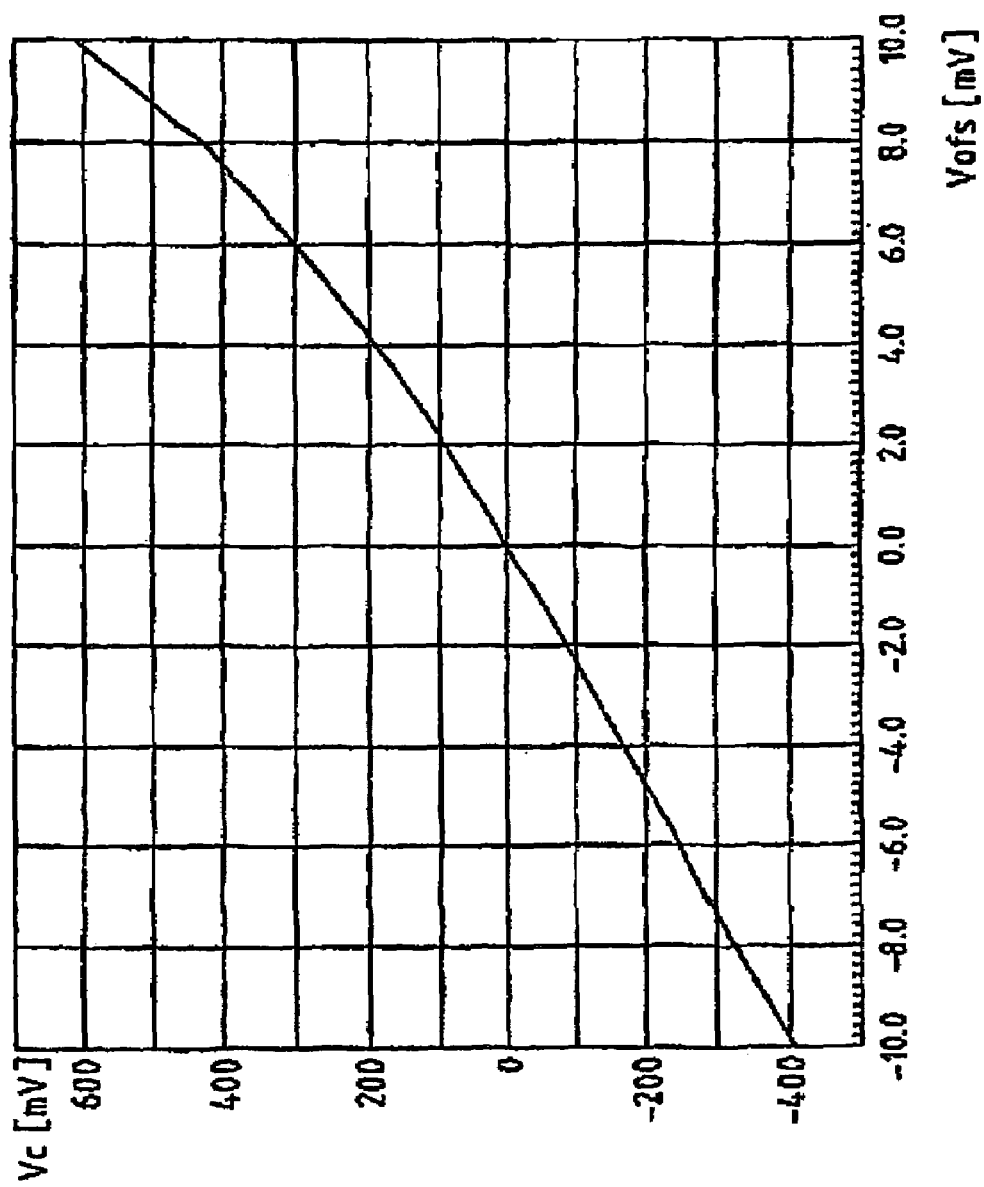
FIG. 3 is a diagram with simulation results for the implementation of FIG. 2.

FIG. 3 shows control voltage Vc vs. input offset voltage Vofs resulting in a simulation for Io=0. The input offset voltage Vofs was varied for the simulation between −10 mV and +10 mV, resulting in a required voltage Vc between −410 mV and +620 mV. This is a reasonably large range to achieve a high resolution for a properly designed CMOS operational amplifier, where the typical offset is less than 3 mV-4 mV. The depicted curve is essentially linear, with a slight bend for positive values of the input offset voltage Vofs. The reason for this is that, in order to obtain a simple implementation, the control voltage Vc is applied only to the gate of transistor MPA, while the gate potential of transistor MPB is fixed to voltage Vb. More linear and more symmetric characteristics can be expected, if control voltage Vc is applied to the additional differential stage as differential signal, i.e. if a voltage of +Vc/2 is applied to the gate of transistor MPA and if a voltage of −Vc/2 is applied to the gate of transistor MPB.

Due to process variations, it is not possible to foresee the exact value of the variable $K_{MPA}$ in equation (3). A practical design has to take this into account by ensuring that the control voltage Vc has an adequate margin. This means that the actual control voltage Vc may experience a larger range than what the simulation shows. Also, it is important to check that within the extended tuning range of the added offset-control circuit has indeed only negligible effect in order to avoid a redesign.

The additional current Ic is delivered by the differential stage as a single-ended signal, in order to keep its influence to the operational amplifier to a minimum. Alternatively, the additional current Ic could be applied to the operational amplifier by means of differential signals. This can be realized by removing transistors MNA and MNB and by connecting the drain of transistor MPA directly to node B. This saves two NMOS transistors. Since node B is a high impedance node, however, a larger influence to the regular operation of the operational amplifier might result.

It is to be noted that the presented embodiments of the invention constitute only selected embodiments which can be varied in many ways.

The invention claimed is:

1. A continuous-time operational amplifier comprising means for introducing an additional current to at least one internal node of said continuous-time operational amplifier for reducing an output offset voltage of said continuous-time operational amplifier, wherein said means for introducing include a voltage source connected between gates of two transistors.

2. The continuous-time operational amplifier according to claim 1, wherein said means for introducing further comprise a transconductor, said voltage source applying a voltage to said transconductor and said transconductor providing said additional current.

3. The continuous-time operational amplifier according to claim 2, wherein said voltage which is applied by said voltage source to said transconductor can be varied.

4. The continuous-time operational amplifier according to claim 2, wherein said transconductor is realized as differential stage.

5. The continuous-time operational amplifier according to claim 4, wherein said transconductor comprises a differential stage with a first, a second, a third and a fourth transistor, wherein said first and second transistors are said two transistors, each of said first, second, third and fourth transistor having a source, a gate and a drain, wherein a bias voltage is applied to said gates of said first and said second transistor, wherein said voltage source applies an additional voltage to said gate of said first transistor, wherein said sources of said first and said second transistor are connected to a supply voltage of said operational amplifier, wherein said sources of said third and said fourth transistor are connected to ground, wherein said drains of said first and said second transistor are connected to said drains of said third and said fourth transistor, respectively, wherein said gate and said drain of said third transistor are short-circuited to each other, wherein said connection between said drains of said second and said fourth transistor are connected to an internal node of said operational amplifier for introducing the additional current to said operational amplifier.

6. The continuous-time operational amplifier according to claim 5, wherein the additional voltage applied to said gate of said first transistor comprises a differential voltage signal applied to said gates of said first transistor and said second transistor.

7. The continuous-time operational amplifier according to claim 1, further comprising feedback means for detecting an output offset voltage of said operational amplifier and for controlling said means for introducing according to a detected offset.

8. The continuous-time operational amplifier according to claim 1, further comprising for its normal operation a differential input stage and a second stage connected to each other, wherein said means for introducing an apply said additional current to a node of said differential input stage.

9. A continuous-time operational amplifier comprising:

means for introducing an additional current to at least one internal node of said continuous-time operational amplifier for reducing an output offset voltage of said continuous-time operational amplifier; and a differential input stage and a second stage connected to each other, said means for introducing applying said additional current to a node of said differential input stage, wherein said differential input stage comprises a first, a second, a third and a fourth transistor, each of said first, second, third fourth transistor having a source, a gate and a drain, wherein said gates of said first and said second transistor are connected to different input terminals of said operational amplifier, wherein said sources of said first and said second transistor are connected to a supply voltage of said operational amplifier, wherein said sources of said third and said fourth transistor are connected to ground, wherein said drains of said first and said second transistor are connected to said drains of said third and said fourth transistor, respectively, wherein said gate and said drain of said third transistor are short-circuited to each other, wherein said connection between said drains of said second and said fourth transistor is connected to said second stage, and wherein said means for introducing an additional current apply said additional current to said connection between said drains of said first and said third transistor.

10. A method for reducing an output offset voltage of a continuous-time operational amplifier, said method comprising the acts of:

providing a voltage source between gates of two transistors; and introducing an additional current using the voltage source to at least one internal node of said continuous-time operational amplifier.

* * * * *